(12) United States Patent
Hayashi et al.

(10) Patent No.: US 7,310,146 B2
(45) Date of Patent: Dec. 18, 2007

(54) MARK POSITION MEASURING METHOD AND APPARATUS

(75) Inventors: Nozomu Hayashi, Tochigi (JP); Yukihiro Yokota, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 454 days.

(21) Appl. No.: 10/912,100

(22) Filed: Aug. 6, 2004

(65) Prior Publication Data
US 2005/0030537 A1 Feb. 10, 2005

(30) Foreign Application Priority Data
Aug. 7, 2003 (JP) ............... 2003-289156

(51) Int. Cl.
*G01B 11/00* (2006.01)
(52) U.S. Cl. .................................... 356/401
(58) Field of Classification Search ........ 356/399–401, 356/614; 355/53–55, 43; 430/522, 30; 250/205, 250/543
See application file for complete search history.

(56) References Cited

U.S. PATENT DOCUMENTS

| | | | | |
|---|---|---|---|---|
| 4,355,892 A * | 10/1982 | Mayer et al. | ................. | 355/77 |
| 5,309,197 A * | 5/1994 | Mori et al. | ................... | 355/53 |
| 5,671,057 A * | 9/1997 | Kawai | ....................... | 356/399 |
| 6,774,374 B1 * | 8/2004 | Driessen et al. | ............. | 355/53 |
| 7,126,689 B2 * | 10/2006 | Nishi | ........................ | 356/400 |
| 2001/0006413 A1 * | 7/2001 | Burghoorn | .................... | 355/53 |
| 2001/0046037 A1 * | 11/2001 | Ota et al. | ..................... | 355/53 |
| 2002/0196421 A1 * | 12/2002 | Tanaka et al. | ................ | 355/53 |
| 2003/0095241 A1 * | 5/2003 | Burghorn | ..................... | 355/53 |

FOREIGN PATENT DOCUMENTS

JP 5-198471 8/1993

\* cited by examiner

*Primary Examiner*—Tarifur Chowdhury
*Assistant Examiner*—Isiaka O Akanbi
(74) *Attorney, Agent, or Firm*—Fitzpatrick, Cella, Harper & Scinto

(57) ABSTRACT

A method of measuring a position of a mark in a chamber in which a pressure inside the chamber is different from a pressure outside the chamber. The method includes a first detection step of detecting a reference mark fixedly disposed in the chamber, through a window arranged on the chamber, using a detector disposed outside the chamber, a second detection step of detecting the mark movable with respect to the reference mark in the chamber through the window using the detector, and a calculation step of calculating a position of the mark with respect to the reference mark based on detection results of the first and second detection steps, so as to suppress a detection error caused by at least one of deformations of the chamber and the window, in which at least one deformation is due to a difference between the pressure inside the chamber and the pressure outside the chamber.

11 Claims, 14 Drawing Sheets

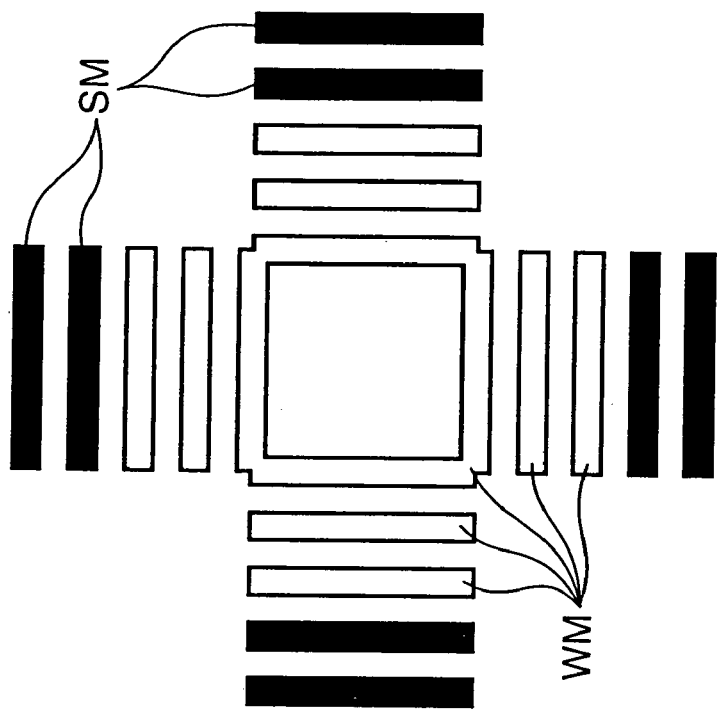
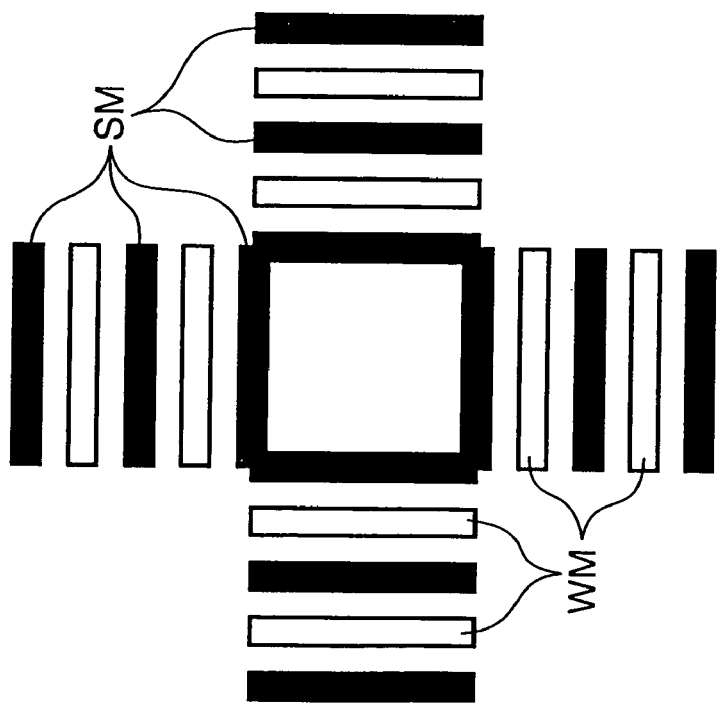

MARK POSITION MEASURING METHOD AND APPARATUS

FIELD OF THE INVENTION

The present invention relates to a mark position measuring method and apparatus, and more particularly, to measuring of the position of a target object in an exposure apparatus used in micro-device manufacture.

BACKGROUND OF THE INVENTION

In a semiconductor element or other device manufacturing process, as exposure devices for transferring a mask or reticle circuit pattern onto a wafer, those that use visible light or ultraviolet light are currently the main types. However, as semiconductor circuit patterns become ever denser, the dimensions of the smallest patterns are approaching the resolution limits of exposure using light of the wavelengths described above. As a result, exposure methods that use smaller wavelength vacuum ultraviolet rays (VUV) and X-rays, or electron beams, have gained attention. For example, an exposure method using vacuum ultraviolet rays and X-rays is described in Japanese Patent Application Laid-Open No. 05-198471.

Vacuum ultraviolet rays (VUV) and X-rays or electron beams experience low transmittance in the atmosphere, and therefore in exposure methods that use such light or beams, the exposure must be conducted within a high vacuum. As a result, carrying out alignment is also subjected to stringent limiting conditions. For example, the wafer that is the detection target object is placed inside a vacuum chamber, but the sensor that senses an alignment mark must be placed outside the vacuum chamber at an observation window in order to combat the effects of escaping gas. Therefore, there is a possibility that the optical axis of the alignment system optical system might be warped by deformation of the chamber housing and observation window due to the difference in pressure between the inside of the chamber and the outside of the chamber, thus leading to an alignment detection error.

SUMMARY OF THE INVENTION

The present invention is conceived in consideration of the above-described problem, and has as an object to make it possible to detect with high accuracy the position of a mark disposed inside a variable-pressure chamber using a sensor disposed outside the chamber.

In particular, it is an object of the present invention to make it possible to detect a mark position accurately even if an observation window of the chamber is deformed due to the difference in pressure between the inside and the outside of the chamber.

According to one aspect of the present invention, there is provided a mark position measuring method comprising: a first measuring step of measuring a position of a first mark disposed inside a variable-pressure chamber using a detector disposed outside the chamber and a second measuring step of measuring a position of a second mark disposed inside the chamber using the detector, wherein a position of the second mark relative to the first mark is determined based on the positions of the first mark and the second mark detected in the first measuring step and the second measuring step, respectively.

Moreover, according to the present invention, an alignment detection apparatus for implementing the above-described position measuring method is provided.

Further, according to the present invention, an exposure device for executing alignment detection or calibration detection based on the above-described mark position measuring method is provided.

Other features, objects and advantages of the present invention will be apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 7A and 7B are diagrams showing examples of marks whose positions can be detected along two axes simultaneously;

DETAILED DESCRIPTION OF THE PREFERRED EMBODIMENTS

Preferred embodiments of the present invention will now be described in detail in accordance with the accompanying drawings.

First Embodiment

Figure 1:
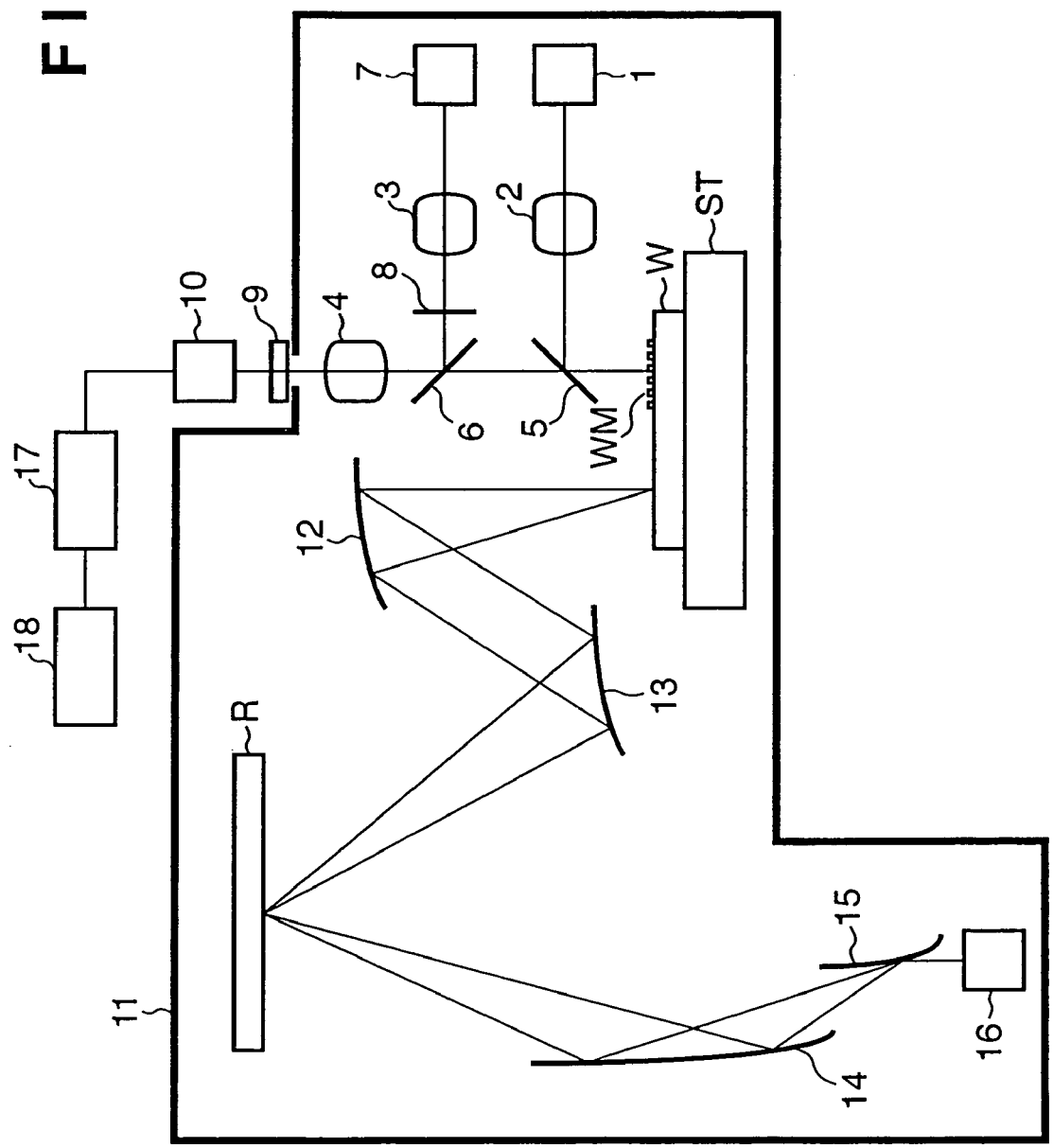
FIG. 1 is a block diagram showing the schematic structure of an exposure device according to a first embodiment of the present invention.

FIG. 1 is a block diagram showing the schematic structure of an exposure device according to a first embodiment of the present invention. In FIG. 1, R designates a reticle, ST designates a wafer stage that can move in three dimensions and W designates a wafer placed atop the wafer stage. An exposure beam projected from an exposure light source 16 is directed onto the reticle R by mirrors 15, 14. The exposure beam reflected from the reticle R according to a drawn pattern is directed onto the wafer W by mirrors 13, 12, thus transferring the pattern on the reticle R onto the wafer W.

Reference numeral 1 designates an alignment illumination unit, 2, 3 and 4 designate focal optical systems, 5 and 6 designate half mirrors, and 8 designates an alignment mark, all disposed inside a chamber 11. It should be noted that the alignment mark 8 is fixed at a predetermined position inside the chamber 11. Moreover, reference numeral 9 designates an observation window, 10 designates an image sensing unit, 17 designates an A/D converter and 18 designates a position detection apparatus, with the image sensing unit 10, the A/D converter 17 and the position detection apparatus 18 disposed outside the chamber 11. The position detection apparatus 18, for example, includes a CPU, a ROM and a RAM (not shown), and calculates the mark position from the alignment mark 8 input from the A/D converter 17 and a wafer mark WM image (two-dimensional digital signal sequence) by the CPU executing a program stored in the ROM. Detection beams for the alignment mark 8 and the wafer mark WM pass through the observation window 9 and reach the image sensing unit 10, although these detection beams have essentially the same optical axis. The position detection apparatus 18 turns the illumination units 1, 7, ON and OFF by executing a program stored in the ROM and implements a process like that to be described below with reference to the flow chart of FIG. 11.

Figure 11:
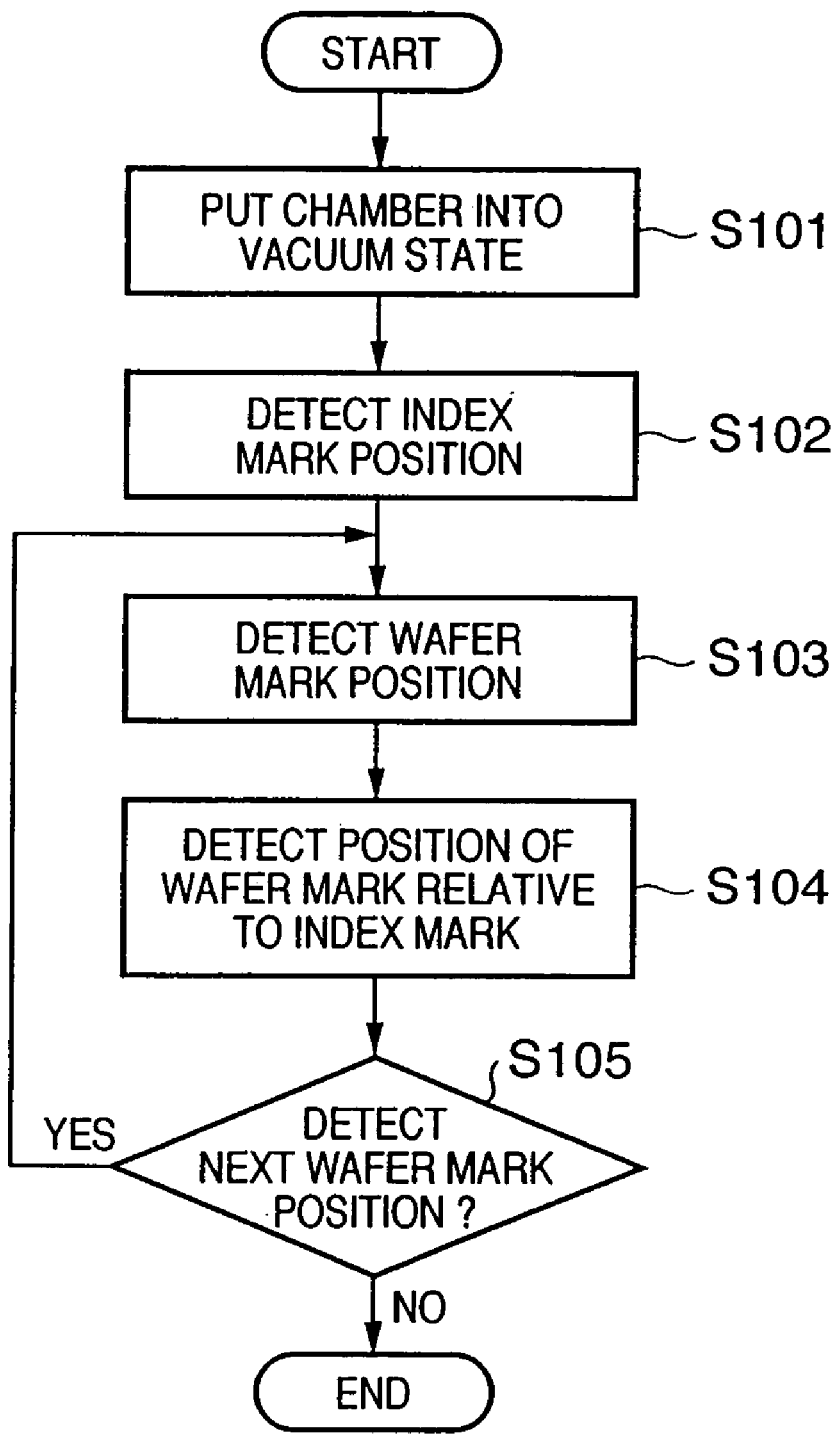
FIG. 11 is a flow chart illustrating a wafer mark position detection process according to a first embodiment of the present invention.

Below, a description is given of an alignment detection process with reference to the flow chart of FIG. 11.

Figure 2A:
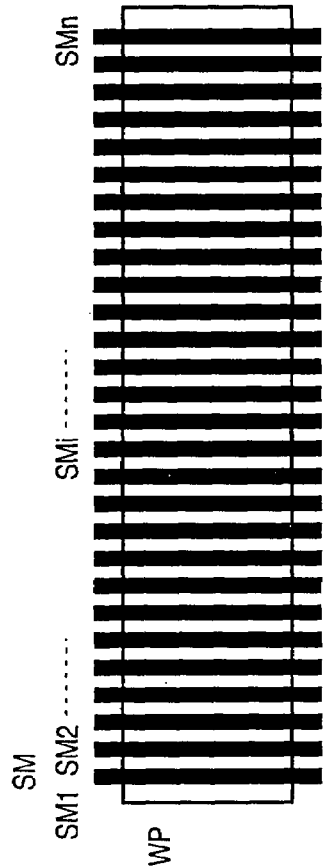
FIGS. 2A, 2B and 2C are diagrams illustrating detection methods according to a first embodiment and a second embodiment of the present invention.
Figure 3:
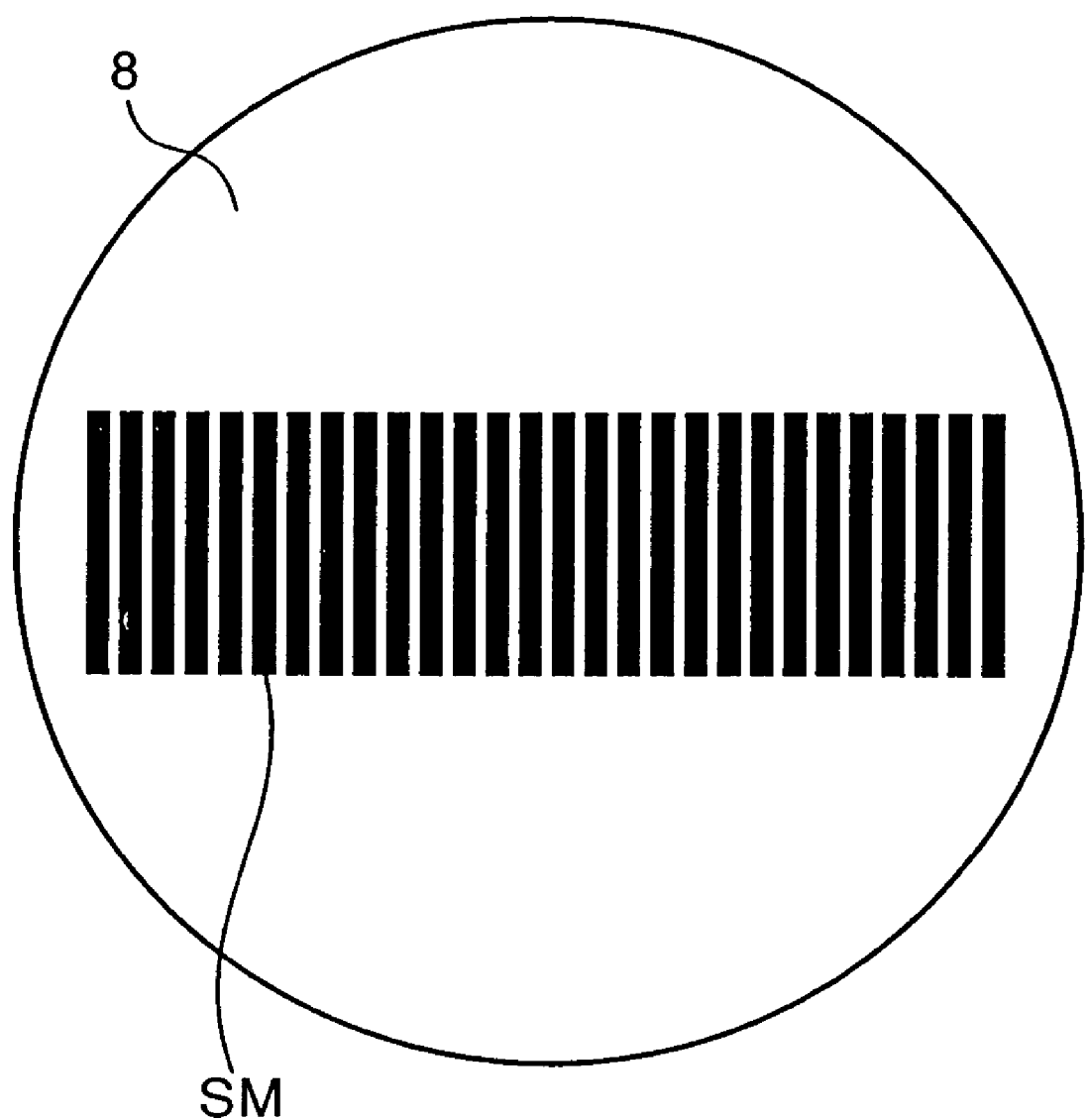
FIG. 3 is a diagram illustrating an example of an alignment mark according to the first and second embodiments of the present invention.

First, the vacuum chamber 11 is put into a high vacuum state by a vacuum pump (not shown) so as to optimize exposure conditions (step S101). After the air pressure has stabilized, the alignment mark illumination unit 7 is lit, the alignment mark 8 is illuminated and the alignment mark 8 position is detected (step S102). FIG. 3 shows a shape of an index mark, with the disposition of a plurality of rectangular slits SM. A beam of light passing through the index mark 8 is reflected by the half-mirror 6 to the image sensing unit 10 through the focal optical system 4 and the observation window 9, so as to form an image on an image sensing surface as shown in FIG. 2A, thus forming an image of the index marks SM1-SMn on the image sensing surface. The light rays thus focused are photoelectrically converted at the image sensing unit 10 and, thereafter, converted into a two-dimensional digital signal sequence at the A/D converter 17. The positions of the index mark SM rectangular patterns are then detected by the position detection apparatus 18. The positions of the rectangles can be obtained by cumulatively projecting an image within a window WP in FIG. 2A along the X axis and determining the center of gravity of the image.

Next, the position of the wafer mark is determined (step S103). When determining the position of the wafer mark, the index mark illumination unit 7 is extinguished and the alignment illumination unit 1 is lit. The beam of light projected from the alignment illumination unit 1 illuminates the wafer mark WM on the wafer W via the focal optical system 2 and the half mirror 5. The shape of the WM, like that of the index mark SM, comprises a plurality of aligned rectangular marks. The beam of light reflected from the wafer mark WM then passes through the half mirrors 5 and 6 to reach the image sensing unit 10 via the focal optical system 4 and the observation window 9, to focus an image like that shown in FIG. 2C on the image sensing surface. Thus, an image of the wafer mark WM is formed on the image sensing surface. The focused beam of light is photoelectrically converted at the image sensing unit 10 and, thereafter, converted into a two-dimensional digital signal sequence. Then, at the position detection apparatus 18, the positions of the wafer mark WM rectangles are detected. The positions of the rectangles are obtained by cumulatively projecting the image within the window WP along the X axis and determining the center of gravity of the image.

Figure 2B:
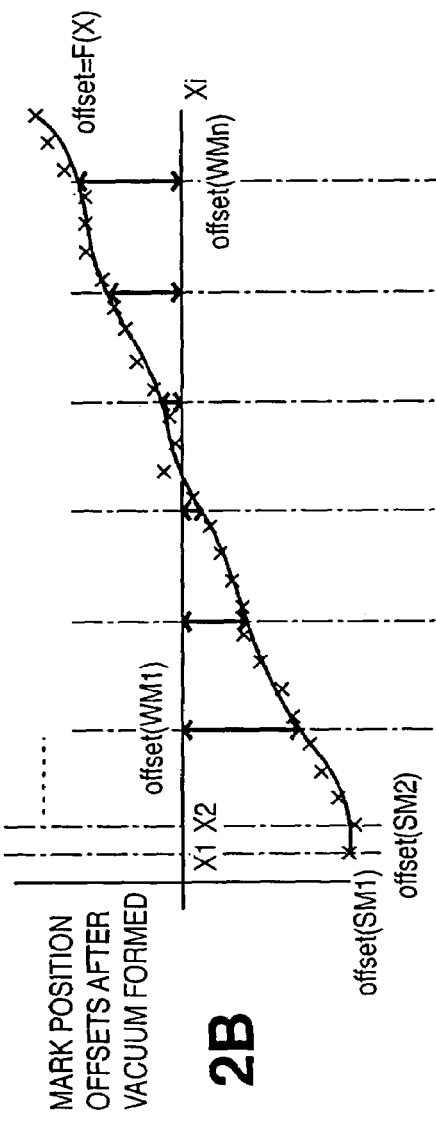

From the positions of the wafer mark WM and the index mark SM detected as described above, the position detection apparatus 18 determines the relative positions of the two marks and aligns the wafer using the index mark as a reference (step S104). For example, the position detection apparatus 18 can determine the position of the wafer mark by determining the average of the positions of the index marks SM1-SMn of FIG. 2A and the average of the positions of the wafer marks WM1-WMp of FIG. 2C, and taking the difference between the two averages. FIG. 2B illustrates a second embodiment of the present invention and is not described here.

It should be noted that, in the alignment detection described above, even if the chamber housing, as well as the observation window, are deformed, and the alignment optical system optical axis is warped by the difference in pressure between the inside of the chamber and the outside of the chamber, because the index mark is disposed outside the chamber, and because, moreover, the detection optical axes for the index mark and the wafer mark are substantially the same, index mark and wafer mark relative position detection error, in other words, wafer mark position detection error, can be reduced. In a case in which another wafer mark position is to be detected, the process starting from the step S103 described above is executed. When detection of the positions of all wafer marks of detection objects is finished, processing ends (step S105).

As described above, according to the first embodiment of the present invention, by using the index mark disposed inside the chamber as a reference, it is always possible to detect accurately the alignment position of a target object even when the chamber housing and observation window are deformed and the alignment optical system optical axis is warped due to the difference in pressure between the inside of the chamber and the outside of the chamber.

Second Embodiment

In the first embodiment, consideration is not given to the occurrence of nonlinear aberration in the alignment optical system due to the difference in pressure between the inside and the outside of the chamber (air pressure inside the chamber). A second embodiment makes high-accuracy alignment mark detection possible even in the event that such aberration occurs. It should be noted that the configuration of a semiconductor exposure apparatus of the second embodiment is identical to that of the first embodiment (FIG. 1).

Figure 12:
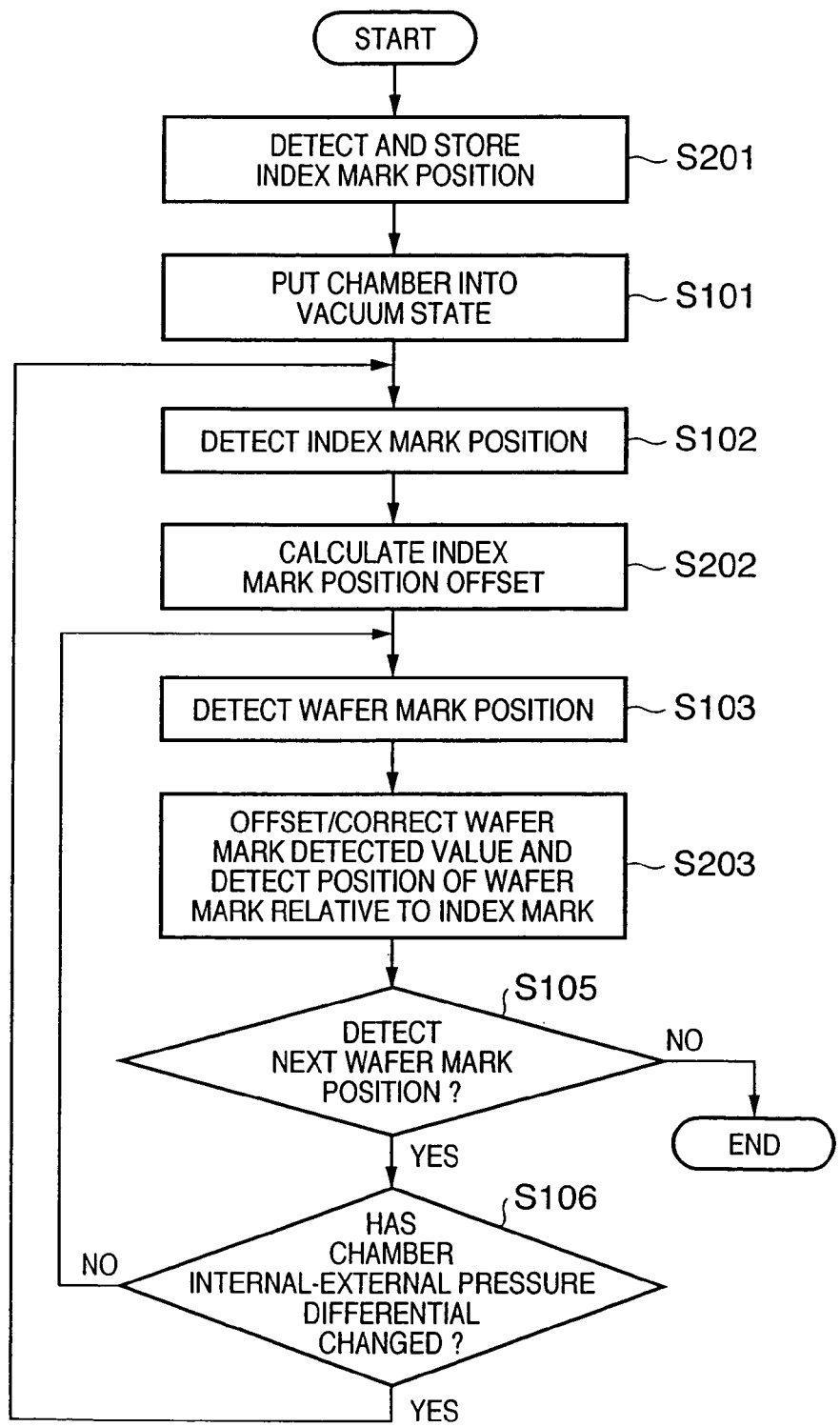
FIG. 12 is a flow chart illustrating a wafer mark position detection process according to a second embodiment of the present invention.

A description is now given of the alignment detection process of the second embodiment, while referring to the flow chart of FIG. 12. It should be noted that steps that are the same as those for the first embodiment (FIG. 11) are given the same reference numeral. First, when the chamber 11 is at atmospheric pressure, the position detection apparatus 18 lights the index mark illumination unit 7, senses the index mark 8 using the image sensing unit 10, and, based on the sensed image thus obtained, detects the position of the index mark 8 and stores this index mark 8 position in a memory, not shown, in the position detection apparatus 18 (step S201). Then, the chamber 11 is put into a vacuum state (step S101) After the vacuum state has stabilized, the index mark illumination unit 7 is lit, and the index mark position is again detected (step S102). Then, an offset is calculated based on the index mark position stored in step S201, and the index mark position obtained in step S102.

In other words, the positions of the rectangles of the index marks when the chamber 11 is at atmospheric pressure are detected and, as shown in FIG. 2B, offsets (offset (SM1), offset (SM2), . . . offset (SMn)) occurring due to the difference in pressure between when the chamber is at atmospheric pressure and after the chamber is put into a vacuum state are calculated. FIG. 2B is a graph showing on the horizontal axis the mark detection positions X1 and on the vertical axis the difference (offset (SMi)) in detected values between when the chamber is at atmospheric pressure and after the chamber is put into a vacuum state. From the graph, a correction curve F (X) is obtained using such methods as polynomial approximation and interpolation. The curve F(X) is the actual correction curve used when detecting a mark on a wafer.

Thereafter, the wafer mark position is detected using the alignment illumination unit 1 and the image sensing unit 10 (step S103). Then, the wafer mark detected value is corrected using the offset correction curve obtained in step S202 and the relative position of the wafer mark relative to the index mark is corrected using the corrected detected values (step S203). Corrected values for the wafer mark rectangles WM1-WMp can be obtained from the correction curve F(X).

Figure 2C:
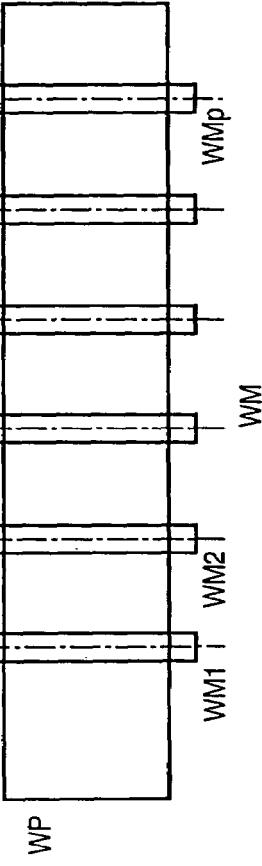

A more detailed description is now given of the operations of steps S103 and S203. In particular, when detecting the wafer mark, the index mark illumination unit 7 is extinguished and the alignment illumination unit 1 is lit. The wafer mark WM on the wafer is illuminated by a light beam emitted from the alignment illumination unit 1 via the focal optical system 2 and the half mirror 5. As described in the first embodiment, an image of the wafer mark is formed on the image sensing surface of the image sensing unit 10 (FIG. 2C). The focus light beam is photoelectrically converted at the image sensing unit 10 and converted to a two-dimensional digital signal sequence at the A/D converter 17. The position detection apparatus 18 then determines the positions of the wafer mark WM rectangles from the two-dimensional digital signal sequence. Then, using a previously determined correction curve F(X), a position offset (offset (WM1), offset (WM2), . . . , offset (WMn)) due to a pressure differential is determined for each of the detected positions of the rectangles WM1-WMp, and the detected positions of the rectangles are corrected. Then, the position of the wafer mark is determined based on the position of the index mark detected when the chamber was at atmospheric pressure and the corrected wafer mark detected position.

It should be noted that, in the second embodiment of the present invention, when the difference in pressure between the inside of the chamber and the outside of the chamber changes, the state of deformation of the chamber housing and the observation window, as well as the aberration described above also change, and in such a case, the index mark position is re-detected. In other words, so long as any change in the internal-external chamber pressure differential does not exceed a predetermined threshold, then when detecting the position of another wafer mark the process described above may be executed starting from step S103 (i.e., steps S105, S106). By contrast, if the change in the internal-external chamber pressure differential does exceed a predetermined threshold, then, when detecting the position of the next wafer mark, the processing returns to step S102 and is executed from that step onward. However, even in a case in which there is no change in the internal-external chamber pressure differential, detection of the position of the index mark may be executed at a predetermined time interval and the offset correction curve F(X) re-calculated. Moreover, although in FIG. 12, the detection of the position of the next wafer is the point in the process at which a check is made for any change in the internal-external chamber pressure differential, the present invention is not limited to such an arrangement. Thus, alternatively, detection of any change in the internal-external chamber pressure differential may be conducted at a predetermined interval, and detection of the index mark may be carried out whenever any change exceeding a threshold value is detected and the correction curve F(X) re-calculated.

Third Embodiment

In a third embodiment of the present invention, the index mark and the wafer mark are detected at the same time, thus enabling correct alignment detection even if there is a change in the internal-external chamber pressure differential. It should be noted that the basic structure of the exposure apparatus of the third embodiment is the same as that of the first embodiment (FIG. 1).

Figure 4:
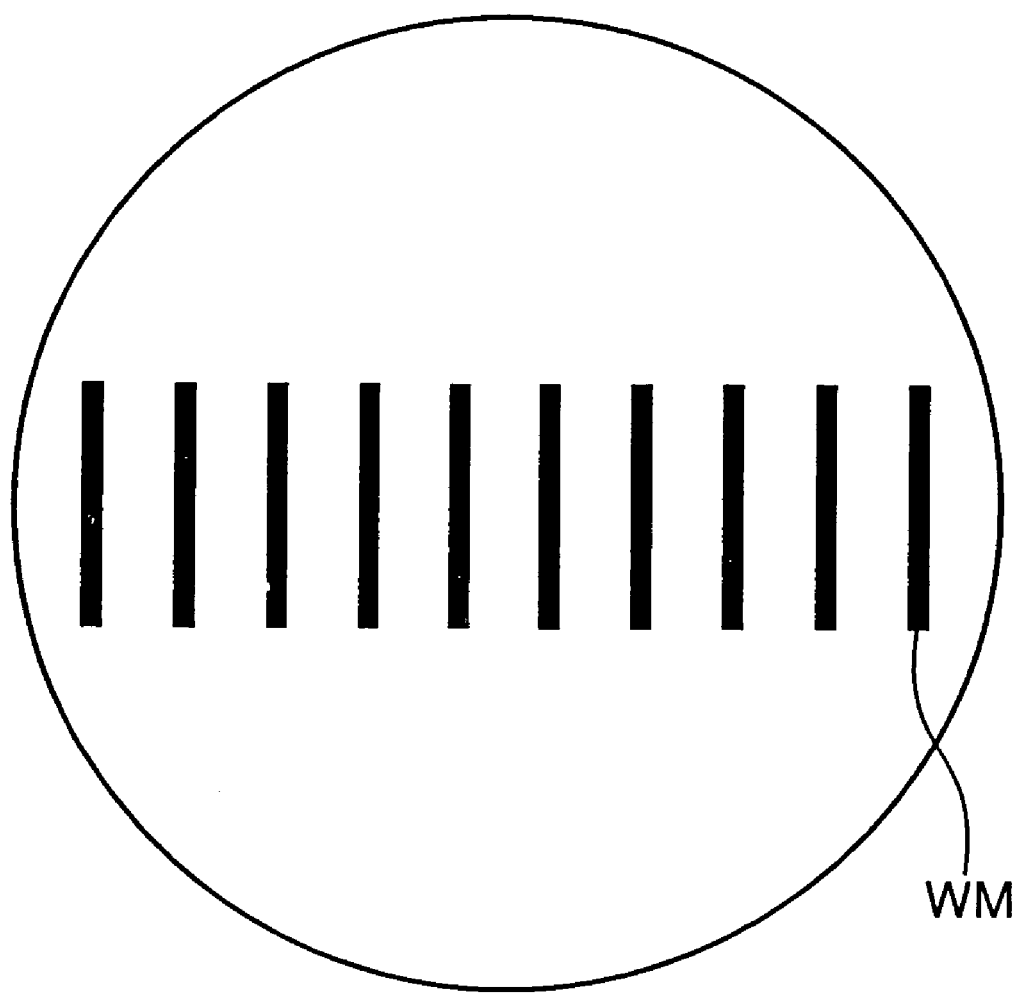
FIG. 4 is a diagram illustrating an example of an alignment mark according to a third embodiment and a fourth embodiment of the present invention.
Figure 5:
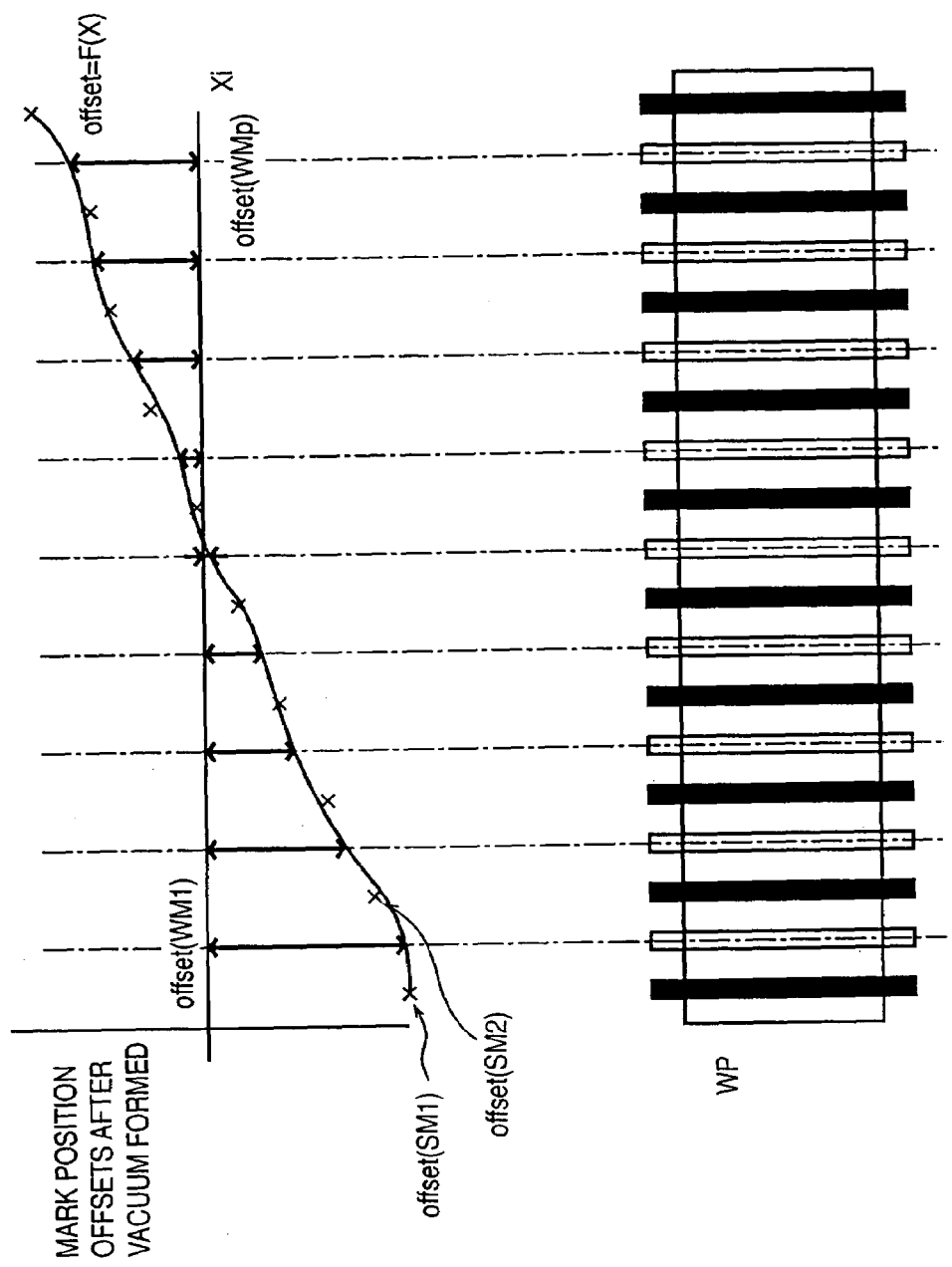
FIGS. 5A and 5B are diagrams illustrating detection methods according to a third embodiment and a fourth embodiment of the present invention.

In the third embodiment, an arrangement is used in which the index mark and the wafer mark rectangles do not overlap in a state in which alignment is conducted at a predetermined accuracy. For example, a mark like that shown in FIG. 4 may be used as the index mark and the wafer mark (in this case, the width and pitch of the index mark rectangles are equal to the width and pitch of the wafer mark rectangles). However, provided they are disposed relative to each other at detectable positions, the index mark and the wafer mark patterns need not be limited to the foregoing configuration. Then, when detecting the wafer mark, the alignment illumination unit 1 is also lit at the same time as the index mark illumination unit 7. As a result, an image of the index mark and an image of the wafer mark are both formed simultaneously on the image sensing surface of the image sensing unit 10 at mutually exclusive positions, as shown in FIG. 5B. (It should be noted that FIG. 5A illustrates a succeeding fourth embodiment of the present invention.) The focused light beam is then photoelectrically converted by the image sensing unit 10, and then converted into a two-dimensional digital signal sequence by the A/D converter. The position detection apparatus 18 detects the positions of the rectangles of the index mark SM and the wafer mark WM from the digital signal (i.e., the wafer mark and index mark images). Thus, as with the first embodiment, the relative positions of the wafer mark WM and the index mark SM are determined, and the wafer is aligned using the index mark as the standard of the reference.

Figure 13:
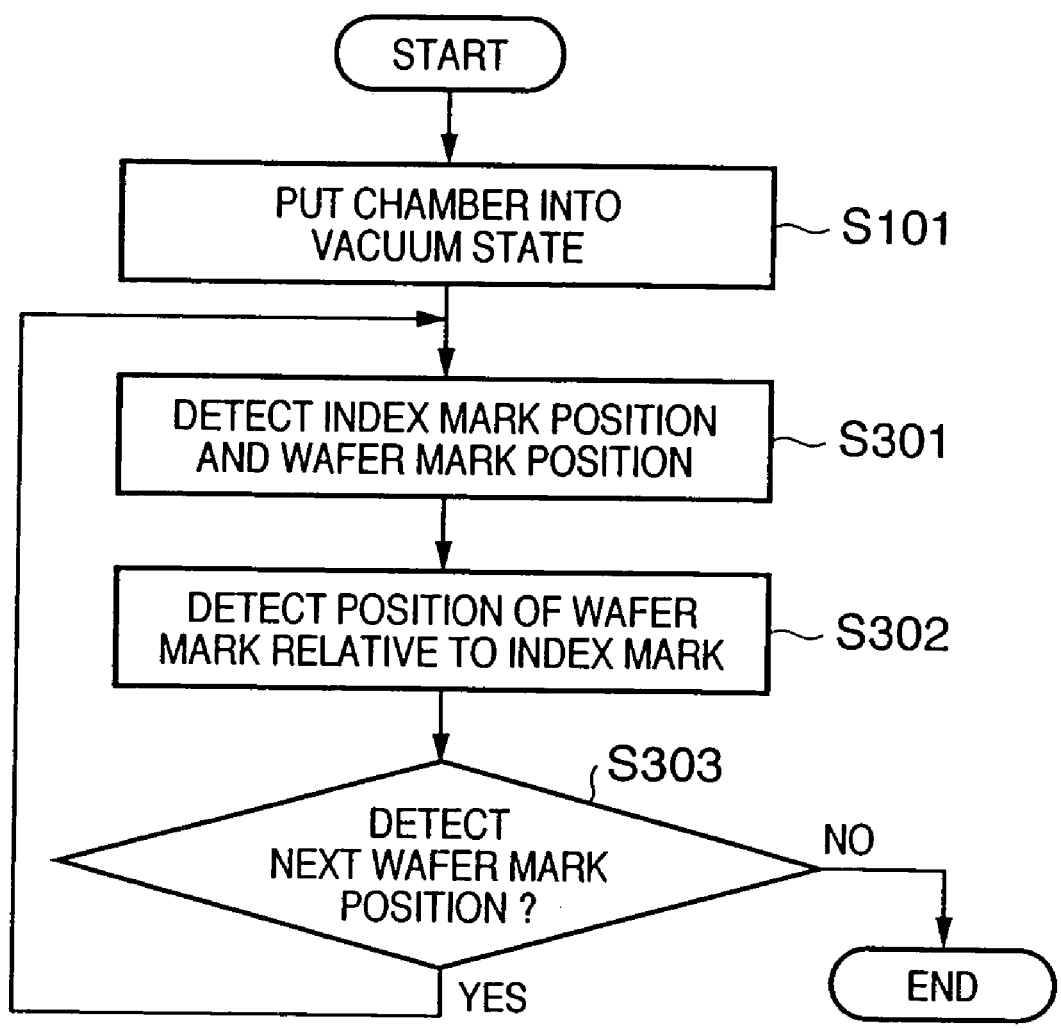
FIG. 13 is a flow chart illustrating a wafer mark position detection process according to a third embodiment of the present invention.

FIG. 13 is a flow chart illustrating a wafer mark position detection process according to a third embodiment of the present invention. After the chamber 11 is put into a vacuum state (step S101), when detecting the position of the wafer mark, as described above, the positions of the index mark and the wafer mark are detected at the same time (step S301). Then, the relative positions of the index mark and the wafer mark are detected based on the simultaneously detected positions of the index mark and the wafer mark (step S302). When detecting the next wafer mark, the process is repeated, starting with step S301 (step S303).

As described above, according to the third embodiment of the present invention, as with the first embodiment, it is always possible to detect accurately the alignment position of a target object even when the chamber housing and observation window are deformed, and the alignment optical system optical axis is warped due to the difference in pressure between the inside of the chamber and the outside of the chamber.

Further, according to the third embodiment, the rectangles that comprise the wafer mark and the rectangles that comprise the index mark do not overlap, and the index mark and the wafer mark that are inside the chamber are sensed at the same time, and the wafer mark position is detected with reference to the index mark. Thus, even if the pressure differential inside and outside the vacuum chamber 11 changes, it is always possible to detect accurately the relative positions of the wafer and index marks.

Further, by using index marks and alignment marks like those shown in FIG. 7A or FIG. 7B, position detection of two axes intersecting atop the wafer can be carried out in a single image sensing. In FIGS. 7A, 7B, the index mark SM and the wafer mark WM are provided at positions that do not overlap.

Fourth Embodiment

In a fourth embodiment of the present invention, the effects of nonlinear aberration are eliminated, as with the second embodiment, while adopting the alignment detection technique of the third embodiment. In this case, as with the second embodiment, detection of the position of the index mark is carried out while the chamber is at atmospheric pressure. Then, after the chamber has been put into a vacuum state, the positions of the wafer mark WM and the index mark SM are detected simultaneously using the same technique as that of the third embodiment described above.

As shown in FIG. 5A, a correction curve F(X) for correcting an offset produced by a difference in pressure is created using index mark 8 detected values. The index mark 8 detected values are corrected using this correction curve F(X). In the fourth embodiment, the index mark 8 is detected when the wafer mark is detected, and, therefore, an offset used when detecting the wafer mark WM is calculated, and the wafer mark detected value is corrected using that offset. The technique employed by the fourth embodiment is a combination of the processes shown in FIG. 12 and FIG. 13. Although not shown in the drawing, step S201 is executed prior to step S101 in FIG. 13, and the position of the index mark 8 is detected while the chamber 11 is at atmospheric pressure. In addition, step S202 is executed after step S301, and an offset calculated from the index mark detected in step S301. Then, by executing steps S202 and S203 instead of step S302, the offset is reflected in the wafer mark position detected in step S301, thus detecting the relative position of the wafer mark relative to the index mark.

As described above, in the fourth embodiment of the present invention, the index mark can be detected at the same time the wafer mark is detected, and, therefore, it is always possible to detect accurately the relative positions of the wafer and index marks, even if the pressure differential inside and outside the vacuum chamber 11 changes. As a result, accurate alignment detection that reduces the impact of an aberration change can be executed even when the internal-external chamber pressure differential changes. It should be noted that, by using index and alignment marks like those shown in FIGS. 7A and 7B, as in the third embodiment, position detection of two axes intersecting atop the wafer can be carried out in a single image sensing.

Fifth Embodiment

In a fifth embodiment, oblique-incidence auto focus (AF) system detection is adapted to the mark position detection of the present invention.

Figure 6:
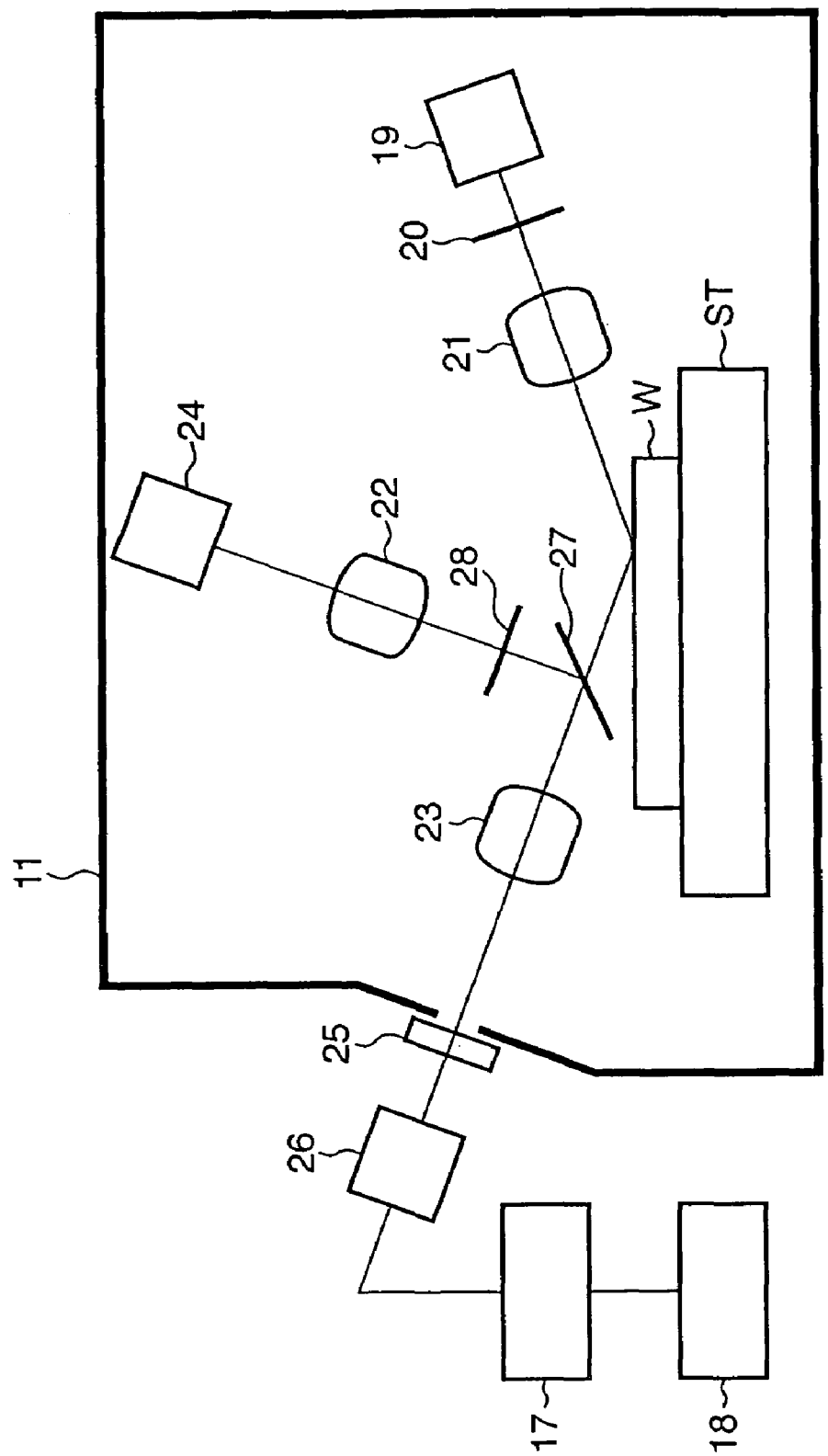
FIG. 6 is a diagram showing a schematic structure of an exposure device according to a fifth embodiment of the present invention.

FIG. 6 is a diagram showing the schematic structure of an alignment detection system of an exposure apparatus according to a fifth embodiment of the present invention. In FIG. 6, reference numeral 19 designates an oblique-incidence AF detection illumination unit, 20 designates an oblique-incidence AF detection mark, 21, 22 and 23 designate focal optical systems, 27 designates a half mirror, 24 designates an index mark illumination unit, 28 designates an index mark, 25 designates an observation window, and 26 denotes an image sensing unit. An A/D converter 17 and an image sensing apparatus 18 are the same as those in embodiments 1 through 4. It should be noted that, for simplicity and clarity of description, FIG. 6 does not show the projection optical system and the reticle necessary for exposure.

In this type of oblique-incidence AF system detection as well, as with the methods described in the first embodiment and the third embodiment, by determining the relative positions of the oblique-incidence AF detection mark and the index mark 28, it is always possible to conduct accurate AF detection (that is, detection of the position of a wafer surface along the projection optical system optical axis and/or the slant of the wafer surface with respect to the optical axis), even if the chamber housing as well as the observation window are deformed and the alignment optical system optical axis is warped by the difference in pressure between the inside of the chamber and the outside of the chamber. In addition, by using the same methods described in the second embodiment and the fourth embodiment, it is possible to correct an offset occurring due to non-linear aberration even when such aberration arises due to the difference in pressure between the inside and the outside of the chamber. It should be noted that, although in FIG. 6, the detection target object is a wafer, the arrangement is the same when detecting the position of a reticle.

Sixth Embodiment

In a sixth embodiment, the mark detection of the present invention is adapted to reticle and wafer calibration. Here, a description is given of an example in which, by detecting the relative positions of an index mark and a reticle mark, as well as the relative positions of the index mark and a wafer stage reference mark, respectively, the relative positions of the reticle mark and the stage reference mark are calibrated.

Figure 8:
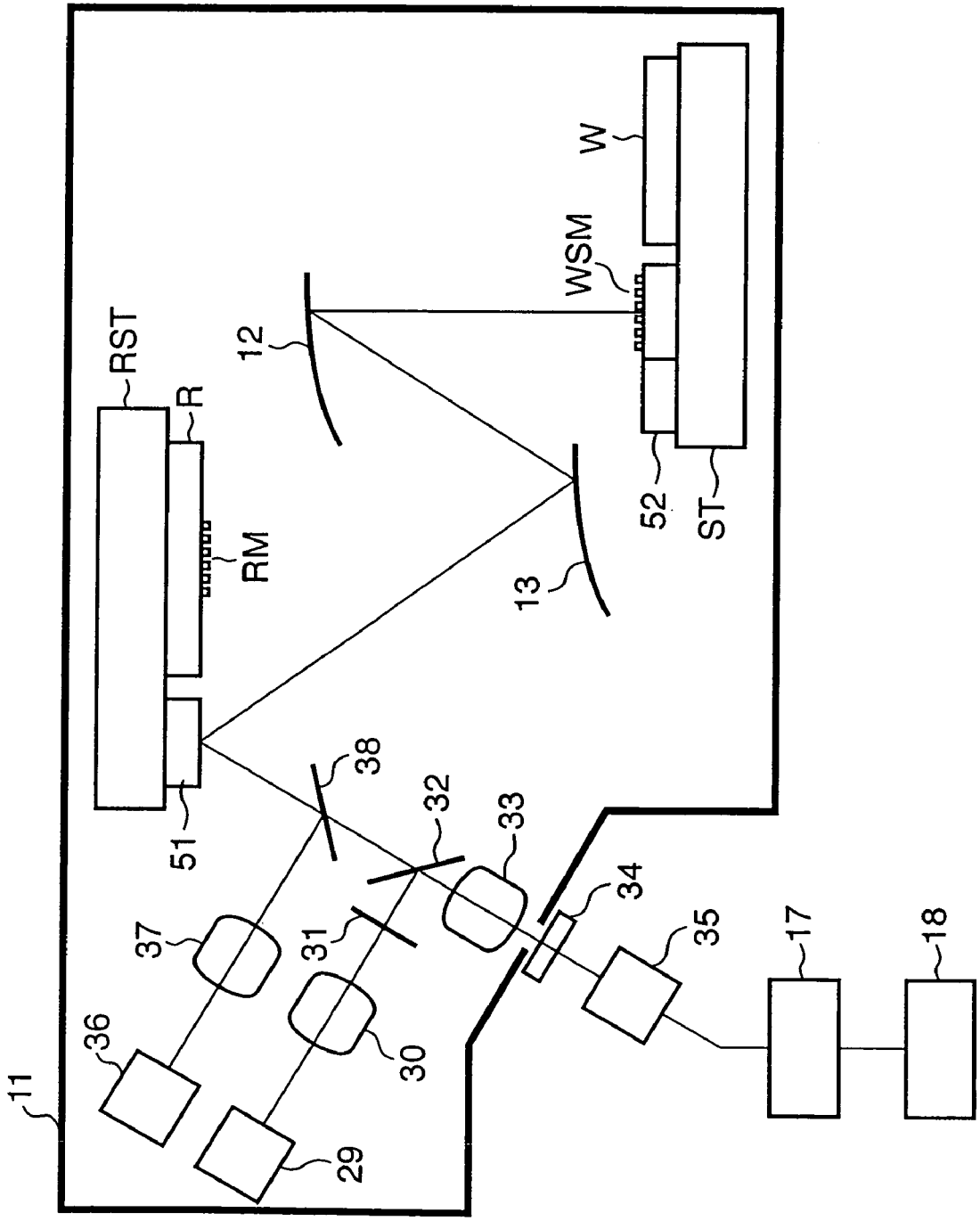
FIG. 8 is a diagram showing a schematic structure of an exposure device according to a sixth embodiment of the present invention.

In FIG. 8, reference numeral 36 designates a calibration detection illumination unit, 29 designates an index mark illumination unit, 30, 33 and 37 designate focal optical systems, 31 designates an index mark, 32 and 38 designate half mirrors, RST designates a reticle stage, R designates a reticle, RM designates a reticle mark, ST designates a stage, WSM designates a reference mark on the stage, 34 designates an observation window, and 35 designates an image sensing unit.

In FIG. 8, when detecting the relative positions of the index mark 31 and the stage reference mark WSM, a reticle stage RST is moved so that a mirror 51 moves into the path of the light, thus enabling a light beam reflected from the wafer mark WSM to be focused on an image sensing surface of the image sensing unit 35. By contrast, when detecting the relative positions of the index mark 31 and the reticle mark RM, the reticle stage RST is moved so that the reticle mark RM moves into the light path and, at the same time, the stage ST is moved so that a mirror 52 moves into the light path. By so doing, an alignment beam reflected by the mirror 52 is reflected by mirrors 12, 13 so as to reach the reticle mark, and the light beam reflected from the reticle mark RM can be focused on the image sensing surface of the image sensing unit 35.

Thus, as described above, the respective positions of the stage reference mark WSM and reticle mark RM can be determined using the index mark as a reference, achieving the calibration described above. In addition, in the respective detections of the stage reference mark WSM and the reticle mark RM, by adapting the configuration of the first embodiment, it is always possible to detect accurately the alignment position of a target object even when the chamber housing and observation window are deformed, and the alignment optical system optical axis is warped due to a difference in pressure between the inside of the chamber and the outside of the chamber. Moreover, by adapting the mark detection technique of the second embodiment, any offset caused by non-linear aberration can be corrected, even if such aberration is due to the difference in pressure between the inside and the outside of the chamber occurs. Further, by adopting the construction of the third and fourth embodiments, reliable calibration is always possible, even in the face of changes in the internal-external chamber pressure differential.

Figure 9:
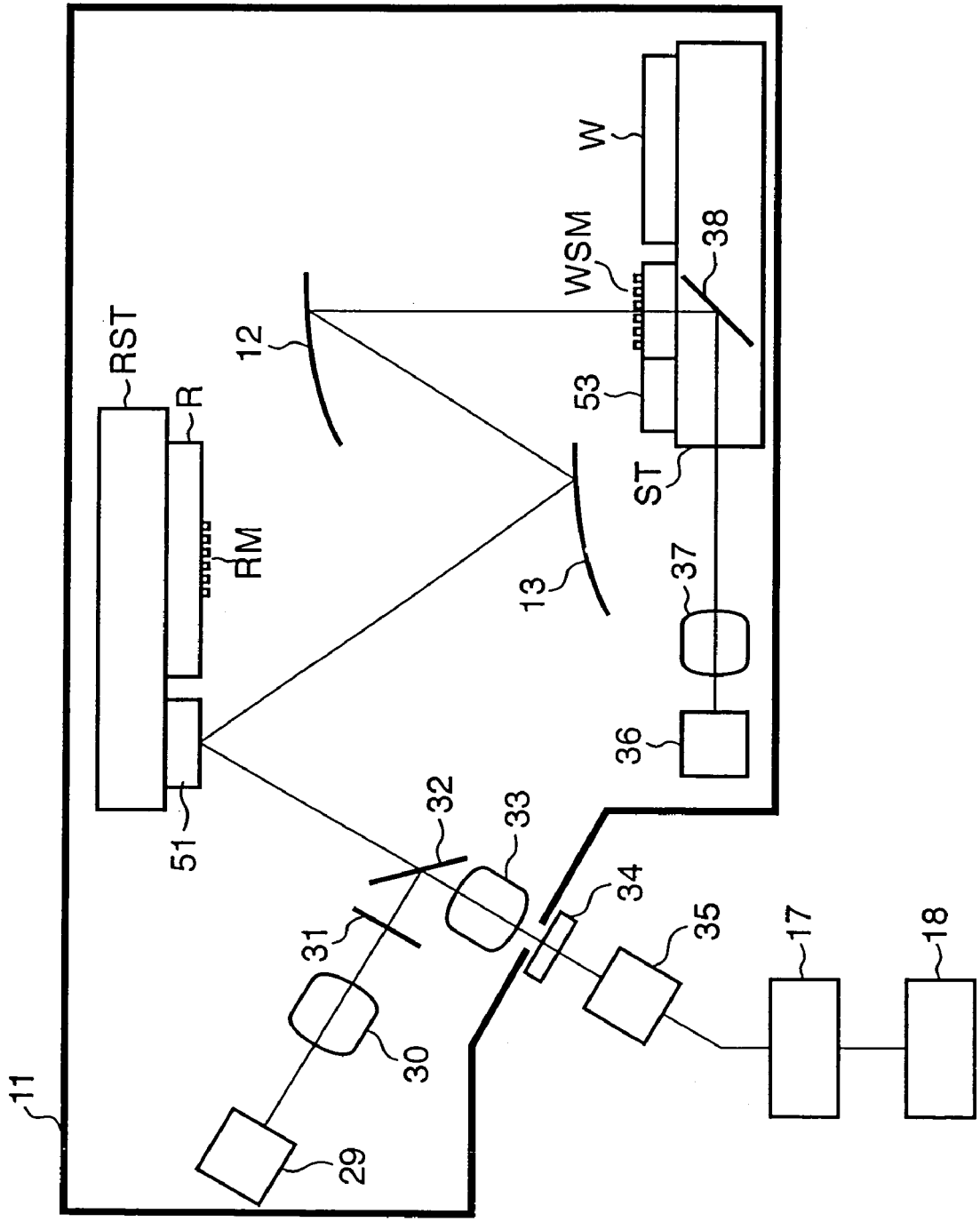
FIG. 9 is a diagram showing another schematic structure of an exposure device according to a sixth embodiment of the present invention.

It should be noted that, although in FIG. 8, the alignment beam is emitted from the reticle side, the present invention may be configured so that, as shown in FIG. 9, the alignment beam originates at the wafer side. In FIG. 9, when detecting the relative positions of the index mark 31 and the stage reference mark WSM, the reticle stage RST is moved so as to move the mirror 51 into the path of the light. By contrast, when detecting the relative positions of the index mark 31 and the reticle mark RM, the reticle stage RST is moved so as to move the reticle mark RM into the light path and, on the wafer side, the stage ST is moved so that a transparent glass portion 53 moves into the light path.

Seventh Embodiment

Figure 10:
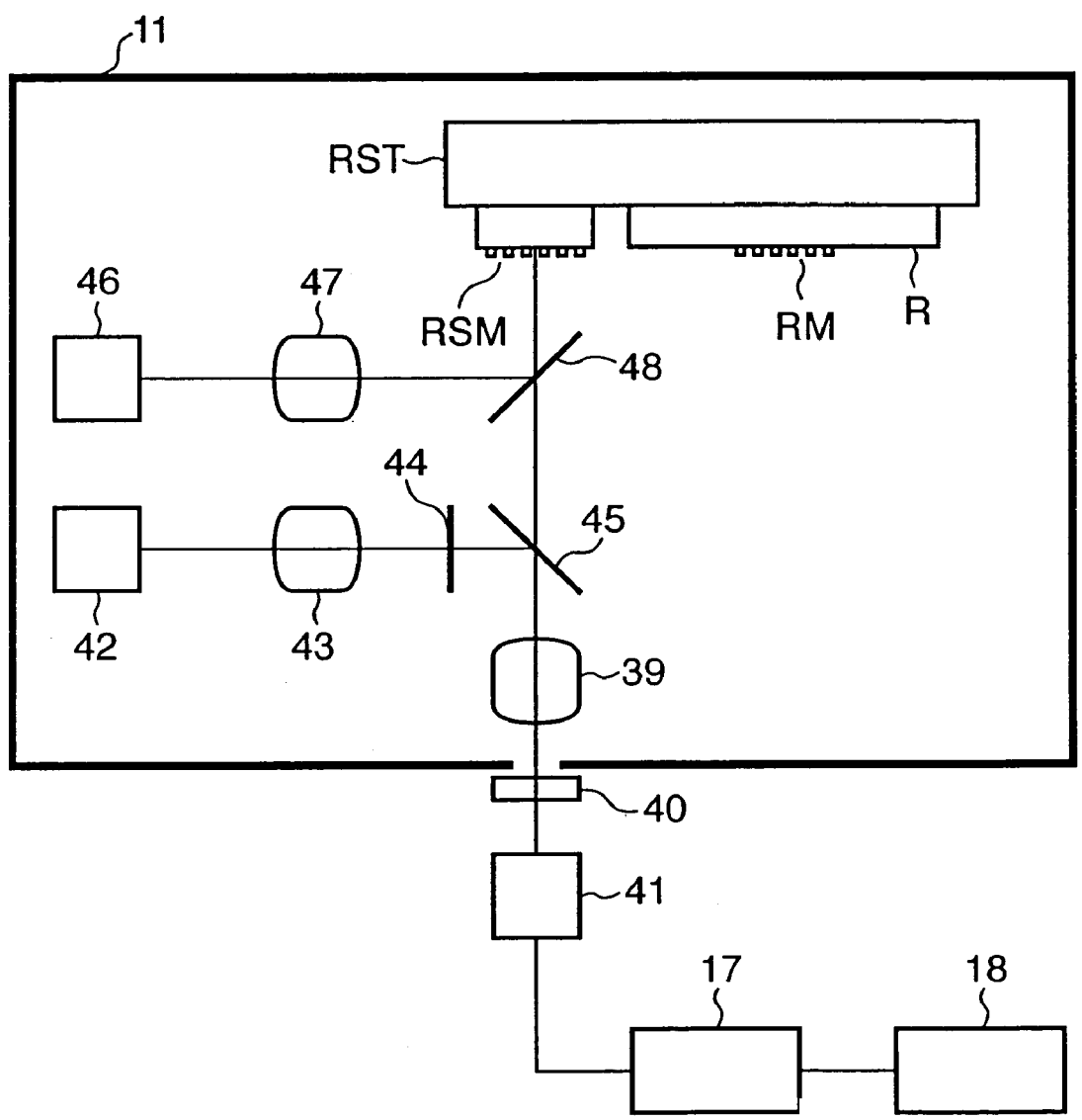
FIG. 10 is a diagram showing another schematic structure of an exposure device according to a seventh embodiment of the present invention.

A seventh embodiment of the present invention adapts the mark detection of the present invention to reticle alignment detection. In FIG. 10, reference numeral 46 designates a reticle alignment illumination unit, 42 designates an index mark illumination unit, 39, 43 and 47 designate focal optical systems, 44 designates an index mark, 45 and 48 designate half mirrors, RST designates a reticle stage, RSM designates a reference mark on the reticle stage, R designates a reticle, RM designates a reticle mark, 40 designates an observation window and 41 designates an image sensing unit. In FIG. 10, the optical systems, wafer stage, and the like, necessary for exposure have been omitted for simplicity and clarity of description.

In the reticle alignment of a reticle mark RM or a reticle reference mark RSM like that shown in FIG. 10 as well, by determining the relative positions of the index mark 44 and the reticle reference mark RSM, or of the index mark 44 and the reticle mark RM, using the same methods as described for the first and third embodiments, the correct alignment mark position can always be detected, even if the chamber housing, as well as the observation window, are deformed, and the alignment optical system optical axis is warped by the difference in pressure between the inside of the chamber and the outside of the chamber. Moreover, by using the same method as that described for the second and fourth embodiments, any offset caused by non-linear aberration can be corrected, even if such aberration due to the difference in pressure between the inside and the outside of the chamber occurs.

It should be noted that, although in the foregoing embodiments, the index mark and the detection target object mark (that is, the wafer mark, reticle mark, wafer stage mark, reticle stage mark, AF detection mark, or the like) are each illuminated by separate illumination units, the present invention may be configured so that light from a single illumination unit is directed to each mark by a mirror, or the like. In addition, the present invention may be configured so that a common illumination unit is used, and the index mark and the detection target object mark are disposed along a common light path.

Moreover, although in the mark position detection process described above, the two-dimensional mark image obtained using the image sensing unit is analyzed, the present invention is not limited to such an arrangement. Thus, for example, the present invention may be configured to detect mark position based on a one-dimensional signal obtained by a line sensor (that is, a one-dimensional image signal).

Further, although in the foregoing embodiments, the index mark is provided inside the chamber, even when the index mark is provided outside the chamber, by using the methods described in the second and fourth embodiments, any mark position detection error can be corrected, even if the chamber housing, as well as the observation window are deformed, and the alignment optical system optical axis is warped by the difference in pressure between the inside of the chamber and the outside of the chamber.

As described above, according to the embodiments, mark position detection error (that is, alignment detection error, oblique-incidence AF detection error, etc.) caused by changes in observation window deformation and detection optical system aberration due to changes in the internal-external chamber pressure differential can be reduced or corrected.

Figure 14:
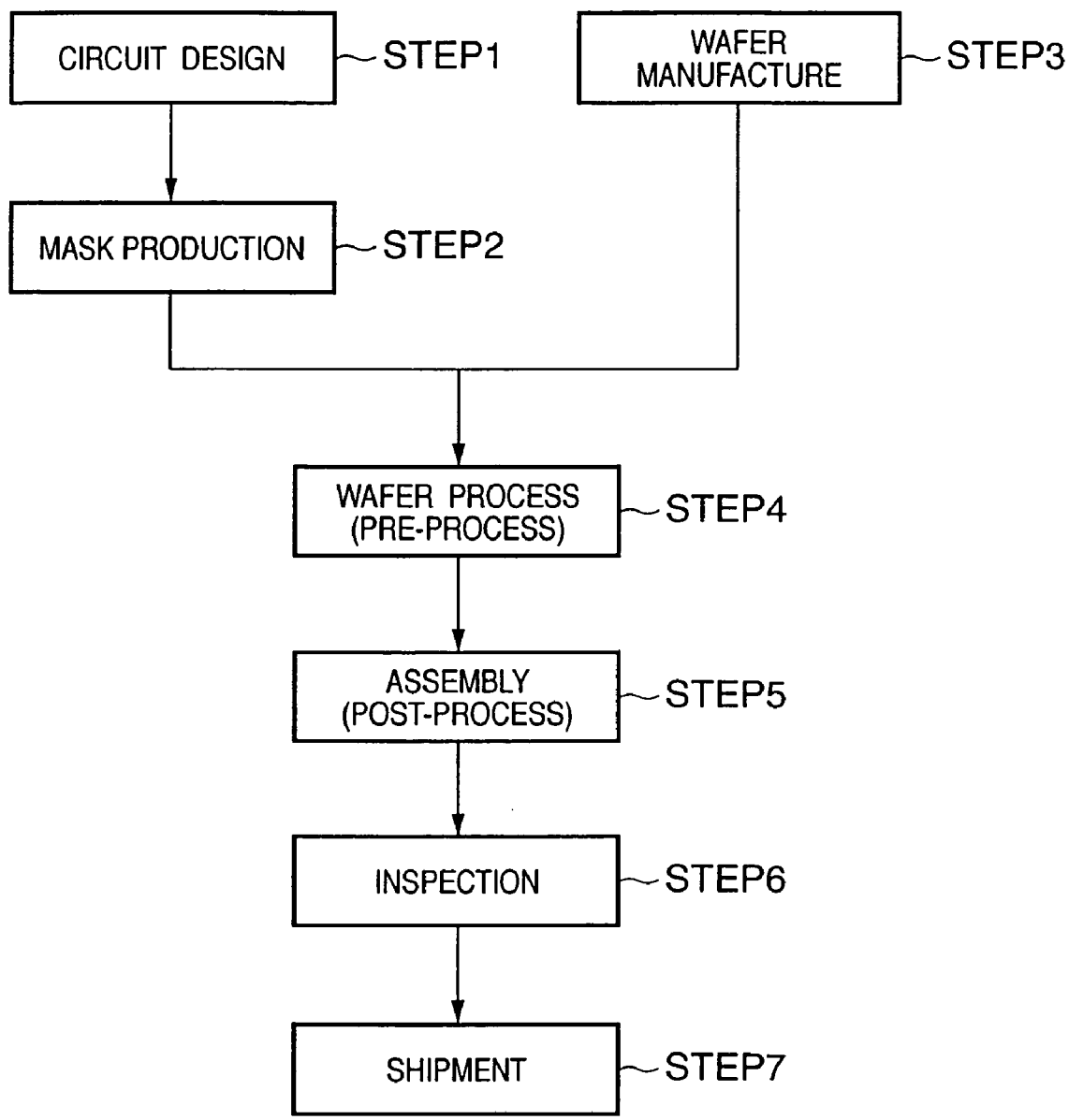
FIG. 14 is a diagram showing a device manufacturing process.

Next, a description is given of a semiconductor device manufacturing process utilizing the exposure apparatus described above, using the example of a device, such as a micro-device. FIG. 14 is a diagram showing a device manufacturing process. In step 1 (circuit design), the design of the semiconductor device is carried out. In step 2 (mask production), a mask is produced based on the designed circuit pattern.

On the other hand, in step 3 (wafer manufacture), a wafer is manufactured using a raw material, such as silicon. Step 4 (pre-process) is called pre-process, in which, using the mask and wafer described above, an actual circuit is formed on the wafer using a lithographic technique according to the exposure apparatus described above. The succeeding step 5 (assembly) is called a post-process, and is a step in which a semiconductor chip is put together using the wafer produced in step 3, while also including such assembly processing as an assembly step (dicing, bonding) and a packaging step (chip insertion). In step 6 (inspection), the operation and durability of the semiconductor device produced in step 5 are tested. Through such processes, a semiconductor device is completed and, in step 7, shipped.

The wafer process of step 4 described above has the following steps: A step of oxidizing the surface of the wafer, a CVD step of forming an insulating layer on the wafer surface, an electrode formation step of forming an electrode on the wafer by vapor deposition, an ion injection step of injecting ions into the wafer, a resist process step of coating the wafer with a photosensitive agent, an exposure step of transferring to the wafer a circuit pattern after the resist process step using the exposure apparatus described above, a development step of developing the wafer exposed in the exposure step, an etching step of removing those portions other than the resist image developed in the developing step, and a resist peel step of removing excess resist after etching is completed. By repeating these steps, a multi-layered circuit pattern is built up on the wafer.

According to the present invention, it is possible to detect with high accuracy the position of a mark disposed inside a variable-pressure chamber by a sensor disposed outside the chamber. Thus, for example, the position of a mark can be accurately detected, even if the chamber observation window is warped by the difference in pressure inside the chamber and outside the chamber.

The present invention is not limited to the above-described embodiments, and various changes and modifications can be made thereto within the spirit and scope of the present invention. Therefore, to apprise the public of the scope of the present invention, the following claims are made.

CLAIM OF PRIORITY

This application claims priority from Japanese Patent Application No. 2003 289156 filed on Aug. 7, 2003, which is hereby incorporated by reference herein.

What is claimed is:

1. A method of measuring a position of a mark in a chamber, a pressure inside the chamber being different from a pressure outside the chamber, said method comprising:
   a first detection step of detecting a reference mark fixedly disposed in the chamber, through a window arranged on the chamber, using a detector disposed outside the chamber;
   a second detection step of detecting the mark movable with respect to the reference mark in the chamber through the window using the detector; and
   a calculation step of calculating a position of the mark with respect to the reference mark based on detection results of the first and second detection steps, so as to suppress a detection error caused by at least one of deformations of the chamber and the window, the at least one due to a difference between the pressure inside the chamber and the pressure outside the chamber.

2. An exposure apparatus for exposing a substrate to a pattern of an original, said apparatus comprising:
   a chamber, having a window, adapted to accommodate the original and the substrate, a pressure inside the chamber being different from a pressure outside the chamber;
   a reference mark fixedly disposed in the chamber;
   a mark disposed on the original, an original stage holding the original, the substrate or a substrate stage holding the substrate, the mark movable with respect to the reference mark;
   a detector disposed outside the chamber, adapted to detect positions of the reference mark and the mark through the window; and
   a calculation unit adapted to calculate a position with respect to the reference mark based on detection results of the reference mark and the mark, so as to suppress a detection error caused by at least one of deformations of the chamber and the window, the at least one due to a difference between the pressure inside the chamber and the pressure outside the chamber.

3. The apparatus according to claim 2, wherein EUV light is used for exposure light.

4. The apparatus according to claim 2, wherein the inside of the chamber is maintained in a vacuum state.

5. The apparatus according to claim 2, wherein the detection of the reference mark by the detector and the detection of the mark by the detector are executed at different timings.

6. The apparatus according to claim 2, wherein the detection of the reference mark by the detector and the detection of the mark by the detectors are executed at substantially the same timing.

7. The apparatus according to claim 2, further comprising:
   a first illuminator, disposed inside the chamber, adapted to illuminate the reference mark; and
   a second illuminator, disposed inside the chamber, adapted to illuminate the mark.

8. An exposure apparatus for exposing a substrate to a pattern of an original, said apparatus comprising:
   a chamber, having a window, adapted to accommodate the original and the substrate, a pressure inside the chamber being different from a pressure outside the chamber;
   a reference mark fixedly disposed in the chamber;
   an original mark disposed on the original or an original stage holding the original, the original mark movable with respect to the reference mark;
   a substrate mark disposed on the substrate or a substrate stage holding the substrate, the substrate mark movable with respect to the reference mark;
   a detector, disposed outside the chamber, adapted to detect positions of the reference mark, the original mark and the substrate mark through the window; and
   a calculation unit adapted to calculate positions of the original mark and the substrate mark with respect to the reference mark based on detection results of the reference mark, the original mark and the substrate mark, so as to suppress a detection error caused by at least one of deformations of the chamber and the window, the at least one due to a difference between the pressure inside the chamber and the pressure outside the chamber.

9. The apparatus according to claim 8, wherein
   the substrate stage moves so that a reflection member disposed on the substrate stage comes into a detection light path, while the position of the original mark is detected by the detector, and
   the original stage moves so that a reflection member disposed on the original stage comes into a detection light path, while the position of the substrate mark is detected by the detector.

10. A device manufacturing method comprising a step of exposing a substrate to a pattern of an original, using an exposure apparatus, said exposure apparatus comprising:
   a chamber, having a window, adapted to accommodate the original and the substrate, a pressure inside the chamber being different from a pressure outside the chamber;
   a reference mark fixedly disposed in the chamber;
   a mark disposed on the original, an original stage holding the original, the substrate or a substrate stage holding the substrate, the mark being movable with respect to the reference mark;

a detector, disposed outside the chamber, adapted to detect positions of the reference mark and the mark through the window; and a calculation unit adapted to calculate a position of the mark with respect to the reference mark based on detection results of the reference mark and the mark, so as to suppress a detection error caused by at least one of deformations of the chamber and the window, the at least one due to a difference between the pressure inside the chamber and the pressure outside the chamber.

11. A device manufacturing method comprising a step of exposing a substrate to a pattern of an original, using an exposure apparatus, said exposure apparatus comprising:

a chamber, having a window, adapted to accommodate the original and the substrate, a pressure inside the chamber being different from a pressure outside the chamber;

a reference mark fixedly disposed in the chamber;

an original mark disposed on the original or an original stage holding the original, the original mark movable with respect to the reference mark;

a substrate mark disposed on the substrate or a substrate stage holding the substrate, the substrate mark movable with respect to the reference mark;

a detector, disposed outside the chamber, adapted to detect positions of the reference mark, the original mark and the substrate mark through the window; and a calculation unit adapted to calculate a position of the original mark and the substrate mark with respect to the reference mark based on detection results of the reference mark, the original mark and the substrate mark, so as to suppress a detection error caused by at least one of deformations of the chamber and the window, the at least one due to a difference between the pressure inside the chamber and the pressure outside the chamber.

* * * * *

UNITED STATES PATENT AND TRADEMARK OFFICE
CERTIFICATE OF CORRECTION

| | |
|---|---|
| PATENT NO. | : 7,310,146 B2 |
| APPLICATION NO. | : 10/912100 |
| DATED | : December 18, 2007 |
| INVENTOR(S) | : Nozomu Hayashi et al. |

It is certified that error appears in the above-identified patent and that said Letters Patent is hereby corrected as shown below:

ON THE COVER PAGE:
In item "(56) References Cited," under "U.S. PATENT DOCUMENTS," in the second column, the last-listed document, "2003/0095241 A1 * 5/2003 Burghorn.............355/53" should read -- 2003/0095241 A1* 5/2003 Burghoorn............355/53 --.

COLUMN 5:
Line 9, "(step S101)" should read -- (step S101). --.

Signed and Sealed this

Nineteenth Day of August, 2008

JON W. DUDAS
*Director of the United States Patent and Trademark Office*